(12) United States Patent
Jackson et al.

(10) Patent No.: US 6,627,822 B2
(45) Date of Patent: Sep. 30, 2003

(54) ELECTRONIC ASSEMBLY WITH SEPARATE POWER AND SIGNAL CONNECTIONS

(75) Inventors: James Daniel Jackson, Beaverton, OR (US); Terrance J. Dishongh, Hillsboro, OR (US); Damion T. Searls, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/893,307

(22) Filed: Jun. 27, 2001

(65) Prior Publication Data

US 2003/0001254 A1 Jan. 2, 2003

(51) Int. Cl.[7] .................................................. H05K 1/16
(52) U.S. Cl. ...................... 174/260; 174/261; 174/262; 257/684; 257/698; 361/777; 361/803
(58) Field of Search .................................. 174/260, 201, 174/262, 203; 361/777, 778, 779, 780, 803; 257/684, 700, 698

(56) References Cited

U.S. PATENT DOCUMENTS

| | | | | |
|---|---|---|---|---|
| 4,811,082 A | * | 3/1989 | Jacobs et al. | 174/261 |
| 4,814,857 A | * | 3/1989 | Werbizky | 174/260 |
| 5,338,970 A | * | 8/1994 | Boyle et al. | 257/698 |
| 6,290,334 B1 | * | 9/2001 | Ishinaga et al. | 347/59 |
| 6,356,166 B1 | * | 3/2002 | Goldsmith et al. | 333/161 |

* cited by examiner

*Primary Examiner*—Albert W. Paladini
(74) *Attorney, Agent, or Firm*—Schwegman, Lundberg, Woessner & Kluth, P.A.

(57) ABSTRACT

A electronic assembly is disclosed and claimed. The electronic assembly includes a first substrate and a second substrate. A plurality of power connections are coupled between the first substrate and the second substrate and a multiplicity of signal connections separate from the plurality of power connections are also coupled between the first substrate and the second substrate. Each of the plurality of power connections have a substantially different size and shape compared to each of the multiplicity of signal connections.

30 Claims, 4 Drawing Sheets

ELECTRONIC ASSEMBLY WITH SEPARATE POWER AND SIGNAL CONNECTIONS

FIELD OF THE INVENTION

The present invention relates generally to electronic circuits, assemblies and the like, and more particularly to an electronic assembly with separate power and signal connectors or connections.

BACKGROUND INFORMATION

In electrically connecting a semiconductor chip, socket or other electronic device to a printed circuit board or the like, two types of electrical connections typically need to be made. One type of connection or group of connections is to deliver power to the semiconductor chip or electronic device and the other type of connection or group of connections is to provide transmission of signals or data between the chip or device and other components on the printed circuit board or elsewhere. Power delivery is a relatively low frequency problem that relies on the bulk property of the conductive material to deliver sufficient current to the chip, device or die or to be able to carry at least the amount of current required or expected to be provided to the chip or device without being damaged or overheated and causing damage to other components. Signal integrity is a relatively high frequency problem that relies on smooth or seamless interfaces or transitions at points or nodes where conductors are joined or soldered together. As chips and other devices are required to perform more functions or operations in shorter periods of time, power requirements and signal requirements for semiconductor chips are continually increasing. The higher power requirements are solved by adding more conductors or power pins that take up more area on the chip and board and result in difficulty in delivering clean power to the devices. Additionally, the increased signal requirements call for additional connections that compete with the increased number of power connections for area on the chip and board. Further, the close proximity of the power and signaling connections can result in electromagnetic interference in delivering error free signaling.

One arrangement for making power connections and signal connections between a printed circuit board and a chip or device or a socket into which the chip or device are mounted involves using solder balls or a ball grid array (BGA) or similar arrangement for both power and signal connections or delivery. Another arrangement for making power and signal connections utilizes a multiplicity of pins attached to the socket or device that are inserted into holes or recesses formed in the circuit board for both power and signal connections. Because the current carrying requirements are much larger for a connection providing power compared to the current carrying requirement for a connection carrying data signals, and because all of the pins or solder balls in both arrangements above are the same size and therefore have the same current carrying capacity, a multiplicity of balls or pins are required to be used in the aggregate to satisfy the power delivery requirements of high performance chips. Hundreds of balls or pins are usually needed to provide the power and ground connections.

The pin contact for a signal connection also may not be as good or reliable as a re-flowed solder ball connection. Smooth or seamless interfaces are more reliable in providing the delivery of clean signals.

Accordingly, for the reasons stated above, and for other reasons that will become apparent upon reading and understanding the present specification, there is a need for an electronic assembly for making power and signal connections between two substrates or between a semiconductor chip, socket or other device and a circuit board or the like that separates the power and signal connections, utilizes the appropriate type of connection and size and shape connection for the function being performed, makes efficient use of available area for making power and signal connections by minimizing the area on the chip or die and on the circuit board needed for making power and signal connections, and may be made efficiently with compatible manufacturing techniques or processes to form both the power and signal connections.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1A:
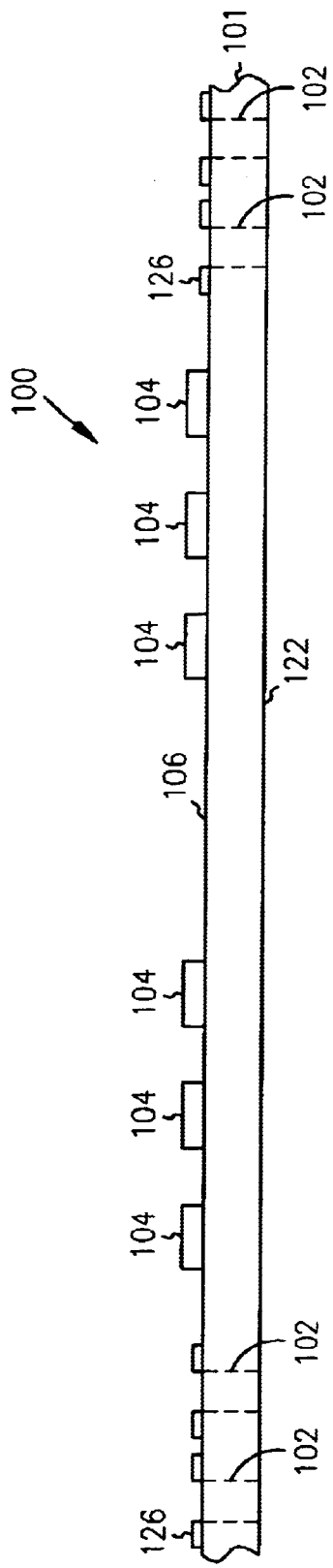
FIGS. 1A–1D illustrate a sequence of steps in making an electronic assembly in accordance with the present invention.
Figure 2:
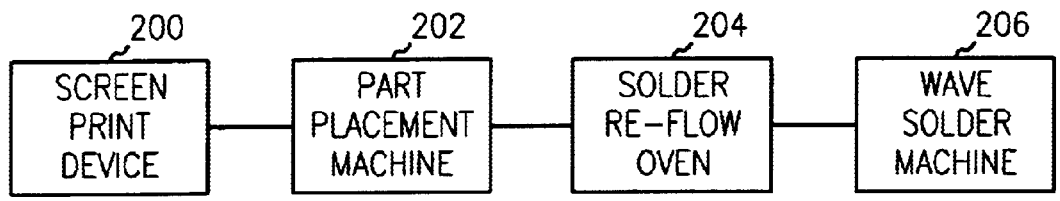
FIG. 2 is a block schematic diagram illustrating the different devices and sequence used in making the electronic assembly in accordance with the present invention.

Referring initially to FIG. 1A which illustrates a first step in a process of making an electronic assembly 100 in accordance with the present invention, a first substrate 101 is provided. The first substrate 101 may be a printed circuit board or the like. A plurality of holes 102 or openings are formed in the first substrate 101 at selected locations. A multiplicity of conductive pads 104 or a conductive layer of material may be formed on the first substrate 101 in a predetermined conductive pattern. Referring also to FIG. 2, which is a block schematic diagram of a group of devices that may be used to make the electronic assembly 100 in accordance with one embodiment of the present invention, the multiplicity of conductive pads 104 may be formed by a screen printing device 200 using known methods. For example, a stencil (not shown) may be placed on a top surface 106 of the first substrate 101. Openings formed in the stencil define the predetermined pattern. Conductive material, such as solder or the like, may then be applied to exposed portions of the top surface 106 by spraying, roller or chemical vapor deposition to form the multiplicity of conductive pads 104 or the conductive pattern.

Figure 1B:
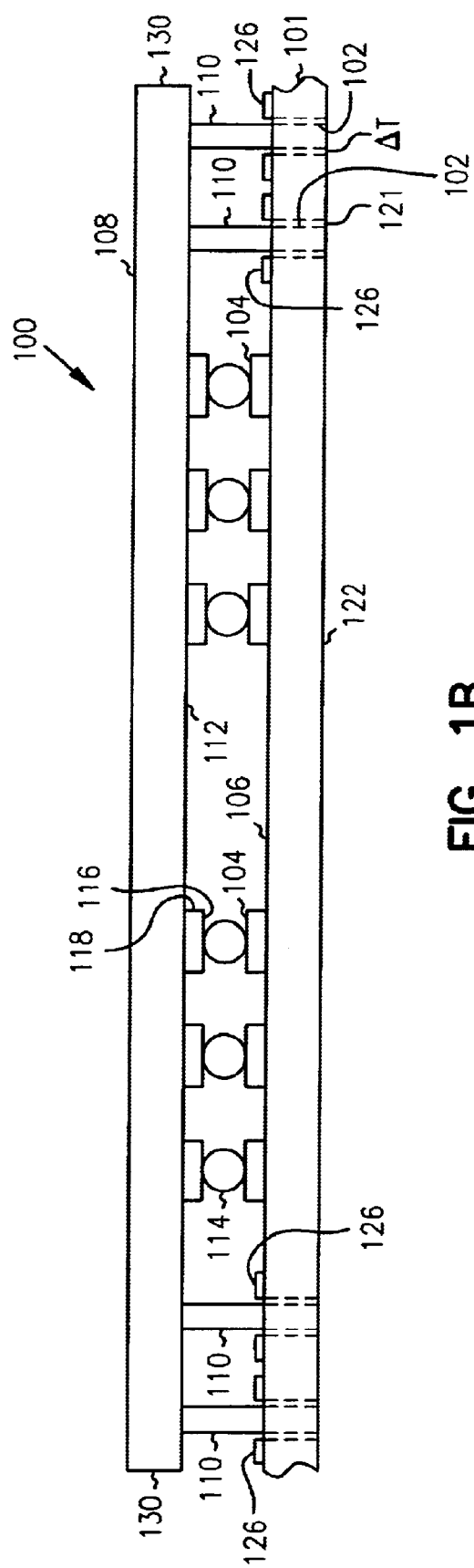

In FIG. 1B, a second substrate 108 is disposed adjacent to the first substrate 101. The second substrate 108 may be a socket to hold a semiconductor chip or may be the chip itself or another electronic device. The second substrate 108 includes a plurality of pins 110 attached to one surface 112 of the second substrate 108 at selected locations. In accordance with the present invention, each of the plurality of pins 110 are received by a corresponding one of the plurality of holes 102 formed in the first substrate 101. A multiplicity of solder balls 114 or the like are disposed between the first substrate 101 and the second substrate 108. The solder balls 114 may be supported in place at predetermined positions on the surface 112 of the second substrate 108 by an adhesive 116 or similar material during a placement operation when the second substrate 108 is placed adjacent to the first substrate 101 by a pick and place machine or part placement machine 202 shown in FIG. 2. Each of the multiplicity of solder balls 114 will substantially, closely align with a corresponding one of the multiplicity of conductive pads 104 formed on the first substrate 101. Each of the multiplicity of solder balls 114 will self-align with the corresponding one of the multiplicity of conductive pads 104 during a re-flow operation as described below.

The second substrate 108 may also include conductive contacts 118 to which the solder balls 114 will become electrically connected. The conductive contacts 118 may be a multiplicity of conductive pads formed in a distinctive pattern. The conductive contacts 118 may also be formed by a screen printing process or the like. The second substrate 108 may be provided with the pins 110, contacts 118, solder balls 114 already formed or attached thereto.

Figure 1C:
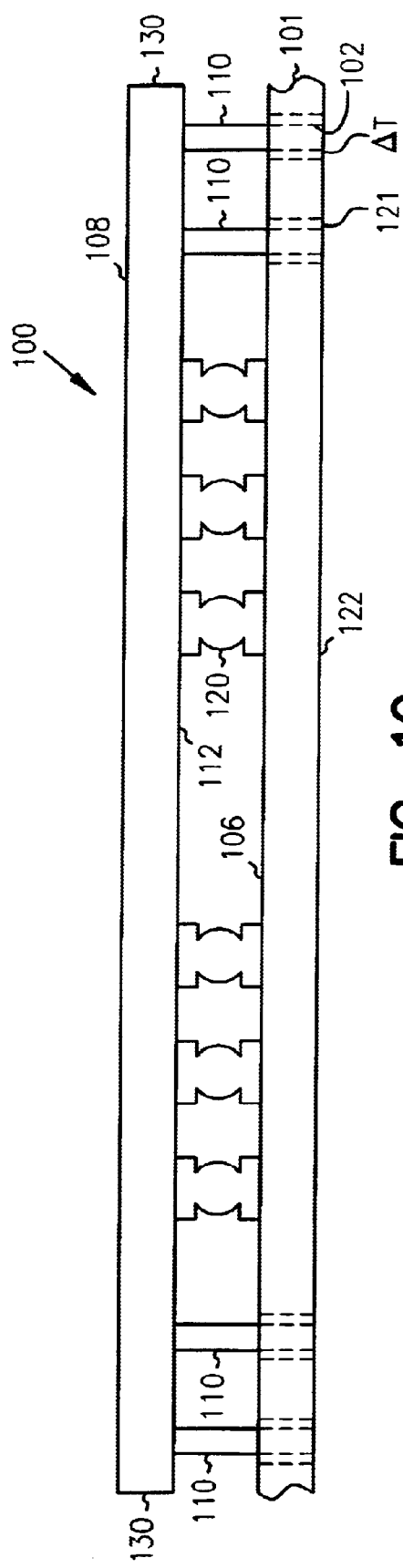

FIG. 1C illustrates the results after performing a solder re-flow operation on the electronic assembly 100. After placement of the second substrate 108 adjacent to the first substrate 101, the electronic assembly 100 is placed in a solder re-flow oven 204 in FIG. 2. During the solder re-flow operation, the electronic assembly 100 is heated under controlled conditions at predetermined temperatures for predetermined periods of time to cause at least each of the solder balls 114 to melt or flow and integrally form an electrical contact or signal connection 120 with each of the corresponding conductive pads 104 on the first substrate 101 and the corresponding conductive contacts 118 on the second substrate 108. Each of the signal connections 120 define a connection for the transmission of signals between the first and second substrates 101 and 108. Each of the signal connections 120 formed by the solder balls 114, conductive pads 104 and conductive contacts 118 is substantially smooth or seamless across the boundaries or interfaces between the solder balls 114, pads 104 and contacts 118 for clean transmission of signals.

In accordance with the present invention, the pins 110 fit into the holes 102 with a predetermined tolerance $\Delta T$ that forms a ring gap 121 between the pin 110 and an interior wall of the hole 102. The ring gap 121 permits the second substrate 108 to move relative to the first substrate 101 so that each of the solder balls 114 can self-align with each of the corresponding conductive pads 104 during the solder re-flow operation. The surface tension of the solder balls 114 when in a liquid state causes them to be pulled into alignment with the conductive pads 104 such that the solder balls 114 and conductive pads 104 will be in alignment when the solder balls 114 cool and resolidify.

Figure 1D:
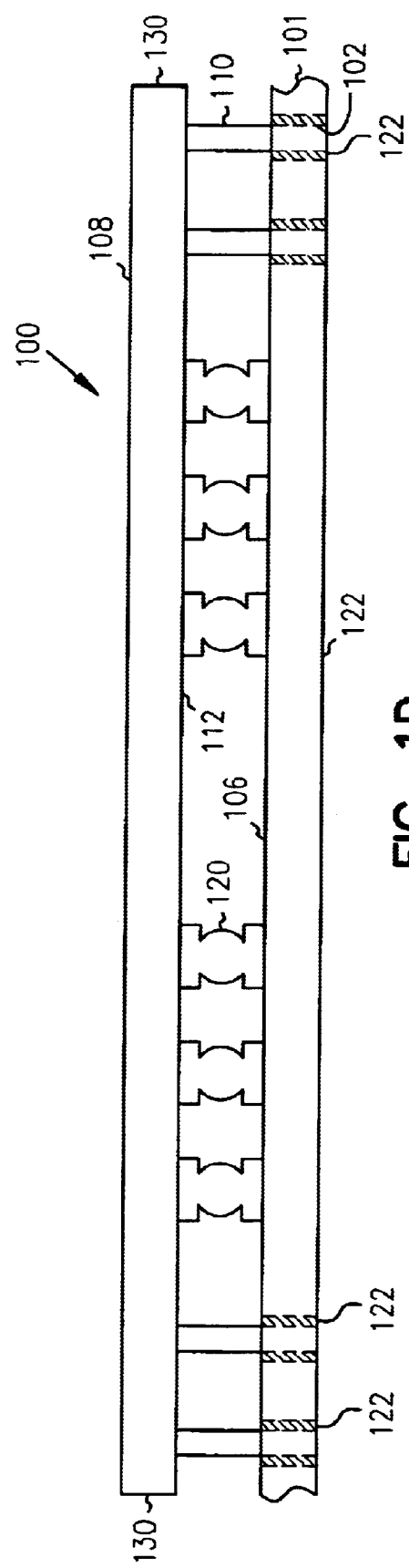

FIG. 1D illustrates the results of a wave soldering operation applied to the electronic assembly 100 to electrically connect the pins 110 to the holes 102 and thereby provide power connections 122 between the first substrate 101 to the second substrate 108. The wave soldering operation is performed by passing the electronic assembly 100 through a wave solder machine 206 in FIG. 2. In the wave solder machine 206, a bottom surface 124 of the first substrate 101 is skimmed over the surface of molten solder (not shown). The molten solder wicks up into the holes 102 by capillary action to form a bond or connection between the interior wall of the hole 102 and the pin 110 to provide the electrical power connection 122 between the first substrate 101 and the second substrate 108. During the wave solder operation the top surface 106 of the first substrate 101 does not become appreciably heated and the solder balls 114 or signal connections 120 will not melt, re-flow or be altered. Accordingly, the re-flow operation to form the signal connections 120 and the wave solder operation to form the power connections 122 are compatible.

In an alternate embodiment of the present invention, solder deposits 126 (FIGS. 1A and 1B) maybe formed on the surface 106 of the first substrate 101 around the holes 102 prior to the second substrate 108 being positioned next to the first substrate 101 with each of the pins 110 inserted into its corresponding hole 102. The solder deposits 126 may be formed at the same time as the multiplicity of conductive pads 104 or in a subsequent operation. During the re-flow operation, the solder deposits 126 will melt and flow into the gaps 121 defined by the predetermined tolerance $\Delta T$ between each pin 110 and hole 102. The solder deposits 126 will resolidify after the re-flow operation to electrically connect each pin 110 to its hole 102. In this embodiment, the wave solder machine 206 (FIG. 2) would not be needed and the duration of the process would be reduced by eliminating the wave soldering operation because the power connections 122 would be formed during the same re-flow operation that the solder balls 114 are melted to form the signal connections 120. This process of depositing the solder deposits 126 and re-flowing to connect to the pins 110 during the solder re-flow operation may be referred to as the pin-in-paste option.

Figure 3:
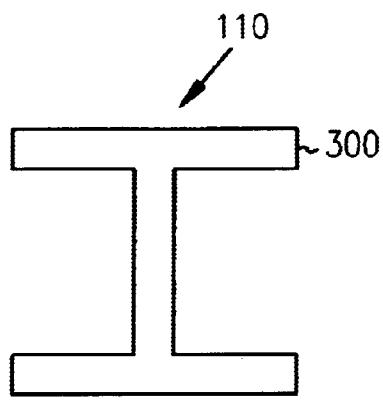
FIG. 3 is an example of a cross-section of a pin to make a power connection in accordance with the present invention.
Figure 4:
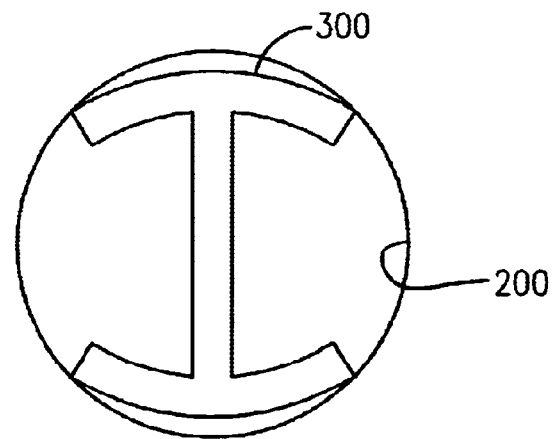
FIG. 4 is an example of a press fit connection between a pin and a hole formed in a substrate in accordance with the present invention.

In another embodiment of the present invention, the power connection 122 between the pins 110 and the holes 102 may be formed by a press fit connection. For example, each of the pins 110 has a cross-section that can be deformed when inserted into the corresponding hole 102. Either the pins 110 are made large enough or the holes are formed such that there is no predetermined tolerance $\Delta T$ or ring gap 121 between the pin 110 and the interior of the hole 102. The deformed pin 110 is retained in the hole 102 by a friction fit and makes electrical contact with the hole 102. One example of a deformable cross-section for each of the pins 110 is a substantially I-beam shaped cross section 300 as shown in FIG. 3. The I-beam shaped cross-section in then deformed when the pin 110 is press fit into the hole 102 as shown in FIG. 4.

In accordance with the present invention, the pins 110 will have a selected size, diameter or cross-section to be able to carry a predetermined amount of current and there will be a predetermined number of pins 110 needed to carry the total maximum current expected to be carried by the power connections 122 between the first and second substrates 101 and 108. The amount of current each of the pins 110 will be capable of carrying will be a function of the cross-sectional area and the bulk material properties of each of the pins 110. The pins 110 will also have a selected shape so as to minimize the area occupied by the pins 110 on the first and second substrates 101 and 108. In the one embodiment discussed above, the pins 110 have a substantially I-beam shape. In another embodiment the pins 110 may be cylindrically shaped and in yet another embodiment, the pins 110 may be formed by morphing multiple solder balls 114 which are fused to electrical contacts similar to the conductive pads 104 to form the power connections 122 between the first and second substrates 101 and 108. The pins 110 may be any selected size and shape that satisfies the power or current carrying needs and is compatible with design constraints or circuit layout constraints. Because of the different functions and current loads on the power connections 122 compared to the signal connections 120, each of the power connections 122 will have a substantially different size and shape compared to the signal connections 120. The relative size of the solder balls 114 compared to the pins 110 is shown to be large in the drawings for purposes of explaining the invention; however, in actuality the solder balls 114 forming the signal connections 120 will be much smaller than the pins 110 forming the power connections 122 that will be required to carry much higher current loads.

The selected locations of the pins 110 is preferably proximate to an edge 130 of the second substrate 108, chip or die. The large size or cross-section of each of the pins 110 also provides support in absorbing mechanical stresses associated with any thermal mismatches between the first substrate 101 or circuit board and the second substrate 108 or chip.

Figure 5:
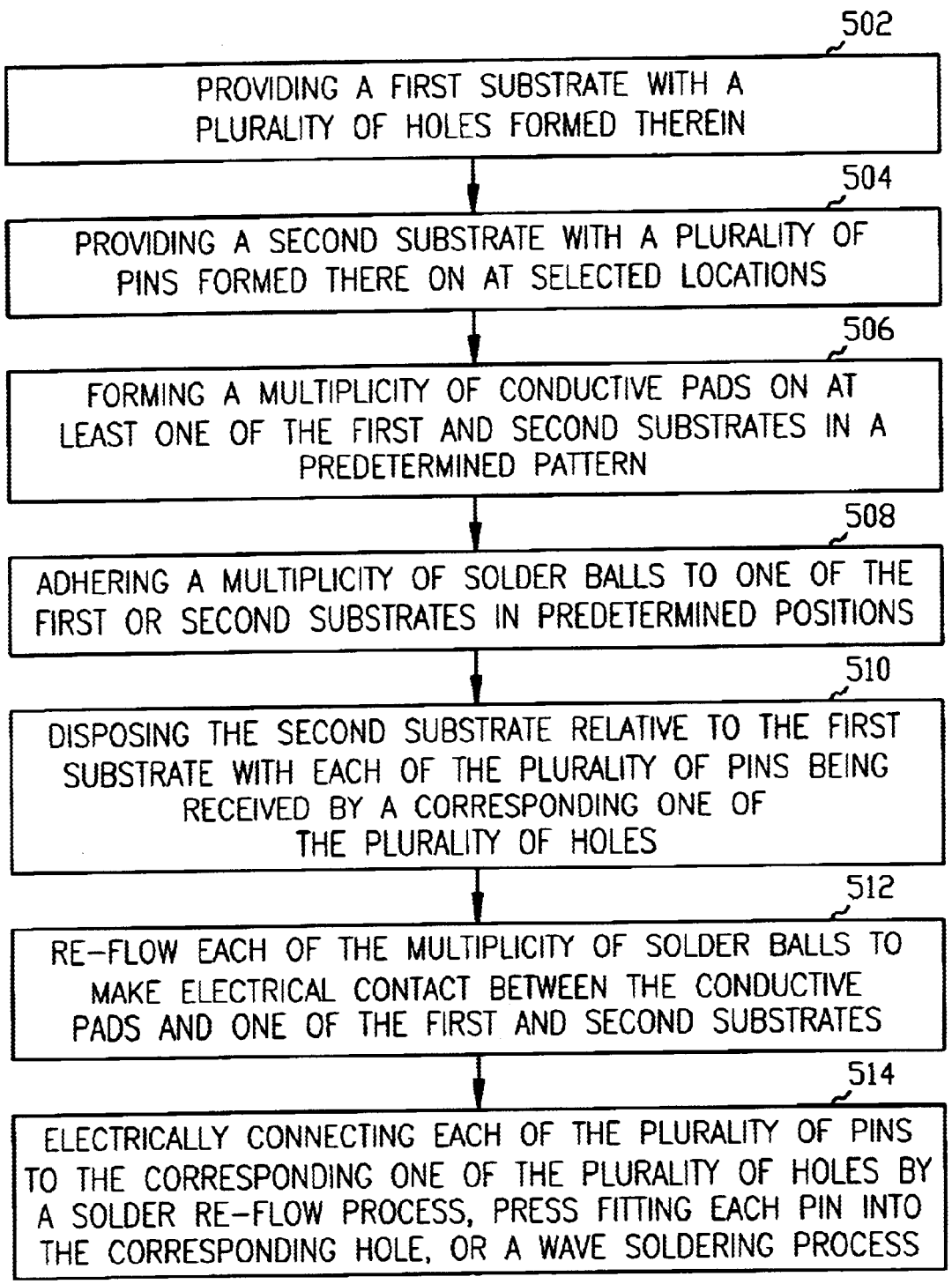
FIG. 5 is a flow chart of a method of making the electronic assembly of the present invention in accordance with the present invention.

FIG. 5 is a flow chart of a method for making the electronic assembly 100 in accordance with at least one embodiment of the present invention. In step 502, a first substrate 101 is provided with a plurality of holes or openings 102 formed therein and in step 504, a second substrate 108 with a plurality of pins 110 formed thereon at selected locations is provided. A multiplicity of conductive pads 104 are formed on at least one of the first and second substrates 101 and 108 in a predetermined pattern in step 506. In step 508, a multiplicity of solder balls 114 are adhered to one of the first substrate 101 or the second substrate 108 in predetermined positions. The solder balls 114 may be attached by a glue or adhesive 116 to hold them in the predetermined positions during manufacturing of the electronic assembly 100. If the second substrate 108 is a chip or socket to support a chip, the second substrate may be provided with the solder balls 114 already attached. In step 510, the second substrate 108 is disposed relative to the first substrate 101 with each of the plurality of pins 110 being received by a corresponding one of the plurality of holes 102 and each of the multiplicity of solder balls 114 being disposed between the first and second substrates 101 and 108. In step 512, a re-flow operation is conducted to re-flow each of the solder balls 114 to make a electrical contact or connection 120 for transmitting signals between the first and second substrates 101 and 108. Each of the solder balls 114 will self-align with a corresponding one of the multiplicity of conductive pads 104 as described above. In step 514 each of the plurality of pins 110 is electrically connected to the corresponding one of the plurality of holes 102 by one of a solder re-flow process, press-fitting or a wave soldering process, as described above. If the press-fit option or embodiment is being used, the pins 110 will be press-fit into the respective holes 102 when the second substrate 108 is disposed relative to the first substrate 101 in step 510. If the re-flow process or pin-in-paste option or embodiment is being used, then the pins 110 are soldered to the respective holes 102 during the solder re-flow process in step 512 to form the power connections 122.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An electronic assembly, comprising:
   a first substrate;
   a second substrate;
   a plurality of power connections coupled between the first substrate and the second substrate; and
   a multiplicity of signal connections separate from the plurality of power connections coupled between the first substrate and the second substrate, wherein each of the plurality of power connections have a substantially different size and shape compared to each of the multiplicity of signal connections.

2. The electronic assembly of claim 1, wherein each of the plurality of power connections are of a different type and are formed by a different process than each of the multiplicity of signal connections.

3. The electronic assembly of claim 1, wherein each of the plurality of power connections comprise a pin that is connected by one of press fitting, wave soldering or re-flow soldering, and each of the multiplicity of signal connections comprises a solder ball that is connected by re-flowing.

4. The electronic assembly of claim 1, wherein each of the plurality of power connections comprises a pin.

5. The electronic assembly of claim 4, wherein at least one of the first and second substrates has a plurality of holes formed therein to receive the pins and each pin includes a cross-section adapted to be press fit into each of the plurality of holes.

6. The electronic assembly of claim 1, further comprising a plurality of holes formed in at least one of the first and the second substrates and wherein each of the power connections comprises a pin, each pin being received into a corresponding one of the plurality of holes and wherein each of the pins is electrically connected to its corresponding hole by one of wave soldering or re-flow soldering.

7. The electronic assembly of claim 1, wherein each of the signal connections comprises a solder ball.

8. The electronic assembly of claim 7, wherein each of the plurality of power connections is a pin and wherein at least one of the first and second substrates has a plurality of holes formed therein to receive each of the pins.

9. The electronic assembly of claim 8, wherein each of the pins fits into each of the plurality of holes with a predetermined tolerance for self-alignment of each of the solder balls with a conductive pattern formed on at least one of the first and second substrates during a re-flow process.

10. The electronic assembly of claim 1, wherein one of the first and second substrates is a printed circuit board and the other one of the first and second substrates is one of a socket or a semiconductor chip.

11. A electronic assembly, comprising:
    a first substrate including a plurality of holes formed therein at selected locations;
    a multiplicity of conductive pads formed on the first substrate in a predetermined pattern;
    a second substrate disposed adjacent to the first substrate;
    a plurality of pins coupled to the second substrate and extending into each of the plurality of holes of the first substrate to make electrical contact between the second substrate and the first substrate; and
    a multiplicity of solder balls disposed between the first substrate and the second substrate and in contact with the plurality of conductive pads.

12. The electronic assembly of claim 11, wherein the plurality of pins are adapted to provide a power connection between the first and second substrates and the multiplicity of solder balls are adapted to provide transmission of signals between the first and second substrates.

13. The electronic assembly of claim 11, wherein each of the pins has a selected size and shape.

14. The electronic assembly of claim 11, wherein each of the pins has a cross-section adapted to be press fit into each of the plurality of holes.

15. The electronic assembly of claim 11, wherein each of the pins has a substantially H-shaped cross-section.

16. The electronic assembly of claim 11, wherein each of the pins has a selected size to carry a predetermined amount of current and the plurality of pins includes a predetermined number of pins to carry at least a total maximum expected current.

17. The electronic assembly of claim 11, wherein each of the pins fits into a corresponding one of the plurality of holes with a predetermined tolerance for self-alignment of each of the solder balls with a corresponding one of the multiplicity of conductive pads during a solder re-flow process.

18. The electronic assembly of claim 11, wherein each of the pins are formed by a plurality of solder balls.

19. The electronic assembly of claim 11, wherein each of the pins is electrically connected to a corresponding one of the holes by one of a wave soldering process or a re-flow soldering process.

20. The electronic assembly of claim 11, wherein the selected locations for each of the plurality of pins are proximate to a peripheral edge of the second substrate.

21. A method of forming an electronic assembly, comprising:
providing a first substrate;
providing a second substrate;
forming a plurality of power connections between the first and second substrates; and
forming a multiplicity of signal connections separate from the plurality of power connections between the first and second substrates, wherein each of the multiplicity of signal connections are substantially smaller in size than and different in form from each of the plurality of power connections.

22. The method of claim 21, wherein forming the plurality of power connections comprises:
inserting each of a plurality of pins attached to the second substrate into a corresponding hole formed in the first substrate; and
making an electrical connection between each of the pins and the corresponding hole.

23. The method of claim 22, wherein making the electrical connection between each of the pins and the corresponding hole comprises one of press fitting each pin into the corresponding hole, wave soldering each pin to the corresponding hole or soldering each pin into the corresponding hole during a solder re-flow process.

24. The method of claim 22, wherein each of the pins are inserted into each of the corresponding plurality of holes with a predetermined tolerance for alignment of each of the multiplicity of signal connections with a predetermined conductor pattern formed on at least one of the first and second substrates when forming the multiplicity of signal connections.

25. The method of claim 21, wherein forming the plurality of power connections comprises providing a plurality of pins, each of the pins having a selected size to carry a predetermined amount of current and the plurality of pins includes a predetermined number of pins to carry at least a total maximum expected current.

26. The method of claim 21, wherein forming the multiplicity of signal connections, comprises:
disposing a multiplicity of solder balls between the first and second substrates; and
re-flowing each of the multiplicity of solder balls.

27. A method of forming an electronic assembly, comprising:
providing a first substrate with a plurality of holes formed therein;
providing a second substrate with a plurality of pin formed thereon at selected locations;
adhering a multiplicity of solder balls to one of the first and second substrates in predetermined positions;
disposing the second substrate relative to the first substrate with each of the plurality of pins being received by a corresponding one of the plurality of holes;
re-flowing each of the multiplicity of solder balls to make electrical contact between the first and second substrates; and
electrically connecting each of the plurality of pins to the corresponding one of the plurality of holes.

28. The method of claim 27, wherein electrically connecting each of the plurality of pins to the corresponding plurality of holes comprises one of press fitting each pin onto the corresponding one of the plurality holes, wave soldering each pin to the corresponding one of the plurality of holes, or soldering each pin to the corresponding one of the plurality of holes during a solder re-flow process.

29. The method of claim 27, wherein each of the pins fits into the corresponding hole with a predetermined tolerance for alignment of each of the plurality of solder balls with a corresponding one of a multiplicity of conductive pads formed on at least one of the first or second substrates.

30. The method of claim 27, further comprising:
coupling each of the plurality of pins to the corresponding one of the plurality of holes to provide a power connection between the first and second substrates; and
coupling each of the multiplicity of solder balls to the first and second substrates to provide transmission of signals between each of the first and second substrates.

* * * * *